United States Patent
Wang et al.

(10) Patent No.: US 10,281,561 B2
(45) Date of Patent: May 7, 2019

(54) QUADRATURE SELF-INJECTION-LOCKED RADAR

(71) Applicant: NATIONAL SUN YAT-SEN UNIVERSITY, Kaohsiung (TW)

(72) Inventors: Fu-Kang Wang, Kaohsiung (TW);
Tzyy-Sheng Horng, Kaohsiung (TW);
Mu-Cyun Tang, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 243 days.

(21) Appl. No.: 15/491,406

(22) Filed: Apr. 19, 2017

(65) Prior Publication Data

US 2018/0224526 A1    Aug. 9, 2018

(30) Foreign Application Priority Data

Feb. 7, 2017 (TW) .............................. 106103881 A (51) Int. Cl.
 *G01S 7/35* (2006.01)
 *H03L 7/24* (2006.01)
 *G01S 13/32* (2006.01)
 *G01S 13/58* (2006.01)
 *G01S 13/00* (2006.01)

(52) U.S. Cl.
 CPC .............. *G01S 7/352* (2013.01); *G01S 13/32* (2013.01); *H03L 7/24* (2013.01); *G01S 13/584* (2013.01); *G01S 2007/358* (2013.01)

(58) Field of Classification Search
 CPC ........ G01S 7/352; G01S 13/32; G01S 13/584; G01S 2007/358; H03L 7/24
 See application file for complete search history.

(56) References Cited

U.S. PATENT DOCUMENTS

| | | | | |
|---|---|---|---|---|
| 4,991,585 A | * | 2/1991 | Mawhinney | ......... A61B 5/0507 340/573.1 |
| 8,665,098 B2 | * | 3/2014 | Jau | ....................... A61B 5/0205 340/429 |
| 8,698,636 B2 | * | 4/2014 | Horng | .................. A61B 5/0205 340/555 |

(Continued)

FOREIGN PATENT DOCUMENTS

| | | |
|---|---|---|
| CN | 102331290 A | 1/2012 |
| TW | 201624195 A | 7/2016 |

OTHER PUBLICATIONS

F.K. Wang et al., "Single-Antenna Doppler Radars Using Self and Mutual Injection Locking for Vital Sign Detection With Random Body Movement Cancellation"; IEEE Transactions on Microwave Theory and Techniques; col. 59, No. 12; Dec. 2011; pp. 3577-3587; IEEE, Piscataway, NJ, USA. (Year: 2011).*

(Continued)

*Primary Examiner* — Bernarr E Gregory
(74) *Attorney, Agent, or Firm* — Jackson IPG PLLC; Demian K. Jackson (57) ABSTRACT

A quadrature self-injection-locked radar utilizes a phase shifter to make a oscillation signal operating in two phase modes, and utilizes a frequency demodulator for frequency demodulation and a signal processor for signal processing to eliminate the nonlinear distortion caused by self-injection locked phenomenon. Therefore, the self-injection locked radar can be applied to more cases for detecting displacement variations with any range.

12 Claims, 7 Drawing Sheets

(56) References Cited

U.S. PATENT DOCUMENTS

| | | | |
|---|---|---|---|
| 8,754,772 B2* | 6/2014 | Horng | G01S 13/88 |
| | | | 340/539.1 |
| 9,603,555 B2* | 3/2017 | Horng | A61B 5/113 |
| 2008/0275337 A1* | 11/2008 | Fossan et al. | A61B 5/0507 |
| | | | 600/428 |
| 2010/0198083 A1* | 8/2010 | Lin | A61B 5/05 |
| | | | 600/484 |
| 2012/0022348 A1 | 1/2012 | Droitcour et al. | |
| 2014/0128748 A1* | 5/2014 | Horng | G01S 13/583 |
| | | | 600/484 |

OTHER PUBLICATIONS

F.K. Wang et al, "Displacement Monitoring System Based on a Quadrature Self-Injection-Locked Radar Technology"; Proceedings of the 2017 IEEE MTT-S International Microwave Symposium; pp. 1363-1366; IEEE, Piscataway, NJ, USA. (Year: 2017).*

Taiwanese Office Action dated Aug. 23, 2017 for Taiwanese Patent Application No. 106103881, 3 pages.

\* cited by examiner

QUADRATURE SELF-INJECTION-LOCKED RADAR

FIELD OF THE INVENTION

This invention generally relates to a self-injection-locked radar, and more particularly to a quadrature self-injection-locked radar.

BACKGROUND OF THE INVENTION

Self-injection-locked (SIL) radar is conventionally applied for detecting important vital signs of biological subject (e.g. respiration and heartbeat). The principle of detection is that SIL radar radiates a radio-frequency (RF) signal to a subject, and the RF signal reflected from the subject is injected into the SIL radar to bring the SIL radar to a SIL state and generate a SIL signal. The displacement of the subject affects the frequency of the RF signal to cause a Doppler effect, for this reason, the SIL signal contains Doppler shift component caused by the displacement of the subject, so that the displacement information of the subject can be obtained by analyzing the SIL signal of the SIL radar in principle. However, when the displacement of the subject is more than 1/10 operating wavelength, the frequency information of the subject cannot be determined accurately because of nonlinear distortion of the waveform caused by SIL phenomenon. No matter the subject's movement is large or small, the conventional SIL radar cannot detect the displacement of the subject based on the variation of the waveform. The conventional SIL radar is limited to detect the vibration frequency of the subject in small movement, so it is only applied for detecting the frequency of the weak vibration subject, e.g. respiration and heartbeat. In addition, the conventional SIL radar cannot even detect the frequency of the vibration when the movement of the subject is large.

SUMMARY

The primary object of the present invention is to provide a quadrature self-injection-locked (SIL) radar using a phase shifter to make an oscillation signal operating in two phase modes. The quadrature SIL radar can generate two SIL signals with different phases when the quadrature SIL radar is locked in the SIL state, therefore can eliminate waveform distortion by the frequency demodulation and the signal processing for detecting the displacement information of the moving subject.

The quadrature self-injection-locked radar of the present invention comprises a self-injection-locked (SIL) loop including a voltage-controlled oscillator (VCO), a phase shifter and a transceiver antenna, wherein the VCO outputs an oscillation signal, the phase shifter adjusts a phase of the oscillation signal to operate in two phase modes, and the transceiver antenna radiates the oscillation signal to a subject, wherein the oscillation signal reflected from the subject is received by the transceiver antenna and transmitted to the VCO for bringing the VCO to a self-injection-locked (SIL) state to generate a first self-injection-locked (SIL) signal and a second self-injection-locked (SIL) signal; a frequency demodulator for receiving the first and second SIL signals, wherein the frequency demodulator demodulates the first and second SIL signals in frequency to obtain a first frequency demodulation signal and a second frequency demodulation signal; and a signal processor for receiving and computing the first and second frequency demodulation signals to obtain a displacement signal of the subject.

The quadrature SIL radar of the present invention utilizes the phase shifter to phase shift the oscillation signal for operating in two phase modes, and generate the first and second SIL signals during the self-injection locking. And the quadrature SIL radar can eliminate waveform distortion by a way of signal processing for more applications.

DETAILED DESCRIPTION OF THE INVENTION

Figure 1:
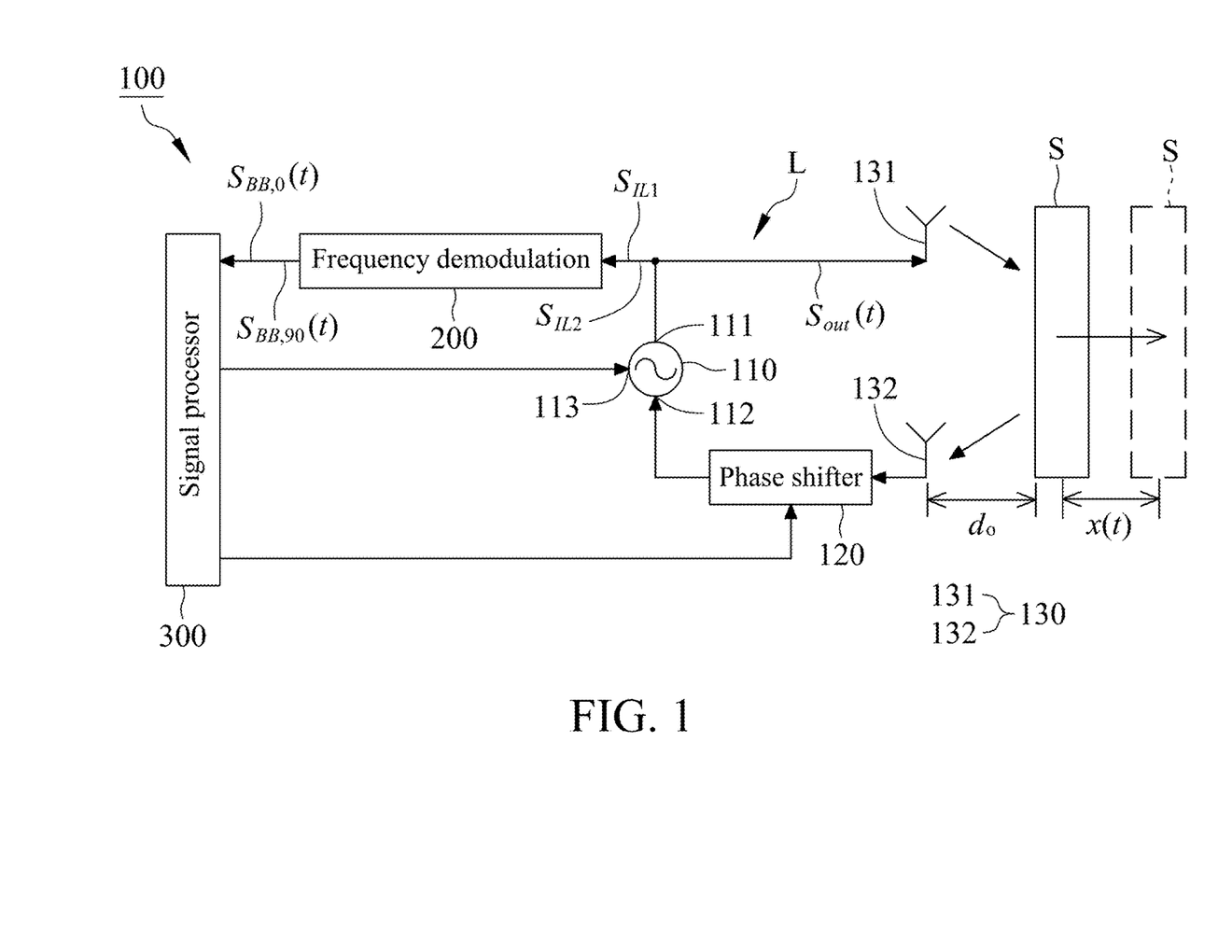
FIG. 1 is a functional block diagram illustrating a quadrature self-injection-locked radar in accordance with the first embodiment of the present invention.

With reference to FIG. 1, a quadrature self-injection-locked (SIL) radar 100 in accordance with a first embodiment of the present invention comprises a self-injection-locked (SIL) loop L, a frequency demodulator 200 and a signal processor 300, wherein the SIL loop L includes a voltage-controlled oscillator (VCO) 110, a phase shifter 120 and a transceiver antenna 130. In the first embodiment, the VCO 110 includes a signal output port 111, a signal injection port 112 and a voltage control port 113, and the transceiver antenna 130 includes a transmit antenna 131 and a receive antenna 132, wherein the signal output port 111 is electrically connected with the frequency demodulator 200 and the transmit antenna 131, the signal injection port 112 is electrically connected with the phase shifter 120, and the voltage control port 113 is electrically connected with the signal processor 300. The signal processor 300 controls the VCO 110 to output an oscillation signal $S_{out}(t)$ from the signal output port 111, the oscillation signal $S_{out}(t)$ is transmitted to the transmit antenna 131 for radiating to a subject S, the receive antenna 132 receives the oscillation signal $S_{out}(t)$ reflected from the subject S, and the oscillation signal $S_{out}(t)$ reflected from the subject S is phase-shifted by the phase shifter 120 and injected into the signal injection port 112 of the VCO 110 to bring the VCO 110 to a self-injection-locked (SIL) state. The signal processor 300 controls the phase shifter 120 to adjust the phase of the oscillation signal $S_{out}(t)$ and make the oscillation signal $S_{out}(t)$ operating in two kind of phase modes. In the first embodiment, the phase shifter 120 shifts the phase of the oscillation signal $S_{out}(t)$ with 90° in one phase mode, and shifts the phase of the oscillation signal $S_{out}(t)$ with 0° in the other phase mode, so the phase difference between the oscillation signal $S_{out}(t)$ injected to the VCO 110 in the two phase modes is 90 degrees which can eliminate the waveform distortion during subsequent signal processing.

The SIL loop L can bring the VCO 110 to the SIL state to generate a self-injection-locked (SIL) signal, therefore the displacement information of the subject S could be obtain by analyzing the SIL signal owing to the oscillation signal $S_{out}(t)$ reflected from the subject S contains the Doppler shift component caused by the moving subject S. Furthermore, the VCO 110 in the SIL state will generate a first self-injection-locked (SIL) signal $S_{IL1}$ and a second self-injection-locked (SIL) signal $S_{IL2}$ because the oscillation signal $S_{out}(t)$ is set in the two phase modes by the phase shifter 120.

With reference to FIG. 1, the frequency demodulator 200 receives the first SIL signal $S_{IL1}$ and the second SIL $S_{IL2}$ from the SIL loop L, and demodulates the first SIL signal $S_{IL1}$ and the second SIL $S_{IL2}$ to obtain a first frequency demodulation signal $S_{BB,0}(t)$ and a second frequency demodulation signal $S_{BB,90}(t)$. The signal processor 300 receives and computes the first frequency demodulation signal $S_{BB,0}(t)$ and the second frequency demodulation signal $S_{BB,90}(t)$ to obtain a displacement signal $\alpha_d(t)$ of the subject S.

In the first embodiment, the signal processor 300 demodulates the first frequency demodulation signal $S_{BB,0}(t)$ and the second frequency demodulation signal $S_{BB,90}(t)$ using an arctangent demodulation to obtain a demodulation signal $S_{demod}(t)$, and the computing formula of the arctangent demodulation is presented as follows:

$$S_{demod}(t) = \tan^{-1} \frac{-S_{BB,0}(t)}{S_{BB,90}(t)} = \alpha_d(t) = \frac{2\omega_{osc}}{c}(d_0 + x(t))$$

wherein $S_{demod}(t)$ is the demodulation signal, $S_{BB,0}(t)$ is the first frequency demodulation signal, $S_{BB,90}(t)$ is the second frequency demodulation signal, $\alpha_d(t)$ is the phase variation caused by the displacement of the subject S, c is the speed of light, $d_0$ is the initial distance between the subject S and the transceiver antenna 130, x(t) is the displacement amplitude of the subject S, $\omega_{OSC}$ is the initial oscillation frequency of the VCO 110.

The oscillation signal $S_{out}(t)$ is set to operate in the two phase modes with phase difference by the phase shifter 120 in the SIL loop L of the present invention, so the present invention can fundamentally solve the nonlinear distortion caused by the self-injection-locked phenomenon to overcome the limitation of the small movement detection of the conventional SIL radar for extending the application to more general cases.

Figure 2:
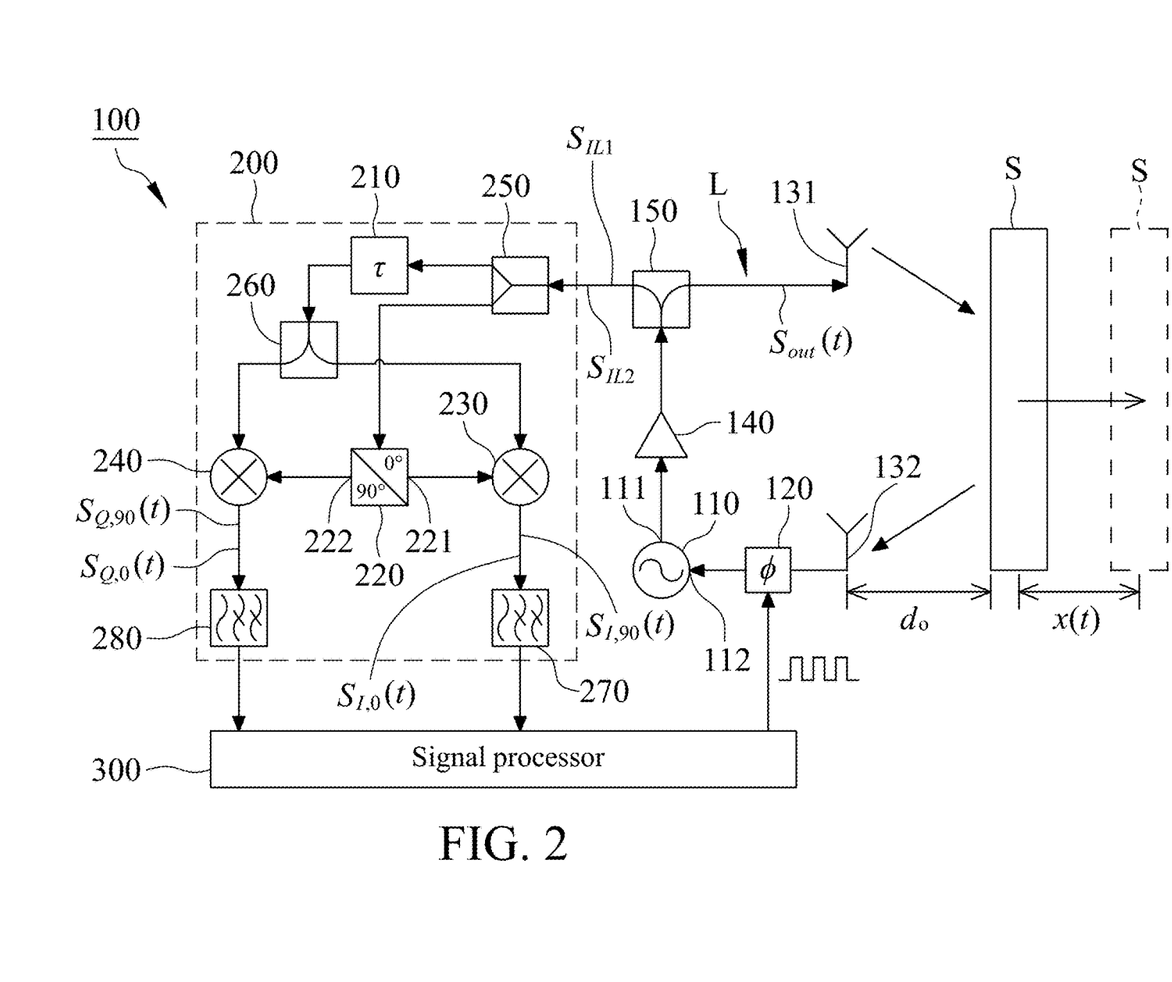
FIG. 2 is a circuit diagram illustrating the quadrature self-injection-locked radar in accordance with the first embodiment of the present invention.

With reference to FIG. 2 which is a circuit diagram in accordance with the first embodiment of the present invention, the SIL loop L further includes an amplifier 140 and a first power splitter 150. In the first embodiment, the amplifier 140 is electrically connected with the signal output port 111 of the VCO 110 for amplifying the oscillation signal $S_{out}(t)$, and the first power splitter 150 is electrically connected with the amplifier 140 for transmitting signals to the frequency demodulator 200 and the transmit antenna 131 respectively, so as to prevent the frequency demodulator 200 from affecting the oscillation of the SIL loop L.

With reference to FIG. 2, the frequency demodulation in the first embodiment is processed, but not limited to, by a non-coherent frequency discriminator, and the frequency demodulation can be processed with different way in other embodiments. The frequency demodulator 200 includes a delay element 210, a quadrature power splitter 220, a first mixer 230, a second mixer 240, a second power splitter 250 and a third power splitter 260, wherein the second power splitter 250 is electrically connected with the first power splitter 150 of the SIL loop L for capturing the first SIL signal $S_{IL1}$ and the second SIL $S_{IL2}$ from the SIL loop L, and the second power splitter 250 transmits the first SIL signal $S_{IL1}$ and the second SIL $S_{IL2}$ to the delay element 210 and the quadrature power splitter 220.

The delay element 210 is electrically connected with the SIL loop L via the second power splitter 250 for receiving and time-delaying the first SIL signal $S_{IL1}$ in and the second SIL $S_{IL2}$, and transmitting the signals to the third power splitter 260. And then the third power splitter 260 transmits the received signals to the first mixer 230 and the second mixer 240.

The quadrature power splitter 220 is electrically connected with the SIL loop L via the second power splitter 250 for respectively splitting the first SIL signal $S_{IL1}$ and the second SIL $S_{IL2}$ into two signals with two different phase modes, wherein the quadrature power splitter 220 includes a 0° output end 221 and a 90° output end 222. The first mixer 230 is electrically connected with the third power splitter 260 and the 0° output end 221 of the quadrature power splitter 220, and the second mixer 240 is electrically connected with the third power splitter 260 and the 90° output end 222 of the quadrature power splitter 220.

The first mixer 230 mix the signals from the third power splitter 260 and the 0° output end 221 of the quadrature power splitter 220 to output a first mixing signal composed of $S_{I,0}(t)$ and $S_{I,90}(t)$ in the two phase modes. And the second mixer 240 mix the signals from the third power splitter 260 and the 90° output end 222 of the quadrature power splitter 220 to output a second mixing signal composed of $S_{Q,0}(t)$ and $S_{Q,90}(t)$ in the two phase modes. The first mixing signal $S_{I,0}(t)/S_{I,90}(t)$ and the second mixing signal $S_{Q,0}(t)/S_{Q,90}(t)$ are transmitted to the signal processor 300 respectively after filtered through a first low-pass filter (LPF) 270 and a second low-pass filter (LPF) 280.

The signal processor 300 receives the first mixing signal $S_{I,0}(t)/S_{I,90}(t)$ and the second mixing signal $S_{Q,0}(t)/S_{Q,90}(t)$ for analyzing the phase modes, and then demodulates the first mixing signal $S_{I,0}(t)/s_{I,90}(t)$ and the second mixing signal $S_{Q,0}(t)/S_{Q,90}(t)$ with the same phase modes by arctangent demodulation to obtain a first arctangent demodulation signal $S_{arc,0}(t)$ and a second arctangent demodulation signal $S_{arc,90}(t)$. The arctangent demodulation is presented as follows:

$$S_{arc,0}(t) = \tan^{-1} \frac{-S_{Q,0}(t)}{S_{I,0}(t)}, \quad S_{arc,90}(t) = \tan^{-1} \frac{-S_{Q,90}(t)}{S_{I,90}(t)}$$

Finally, the signal processor 300 demodulates the first arctangent demodulation signal $S_{arc,0}(t)$ and the second arctangent demodulation signal $S_{arc,90}(t)$ by another arctangent demodulation presented as follows to obtain the phase variation $\alpha_d(t)$ caused by the displacement of the subject S, $$\tan^{-1} \frac{-S_{arc,0}(t)}{S_{arc,90}(t)} = \alpha_d(t)$$

wherein the displacement information of the subject S can be obtained through the formula $$\alpha_d(t) = \frac{2\omega_{osc}}{c}(d_0 + x(t)).$$

Figure 3:
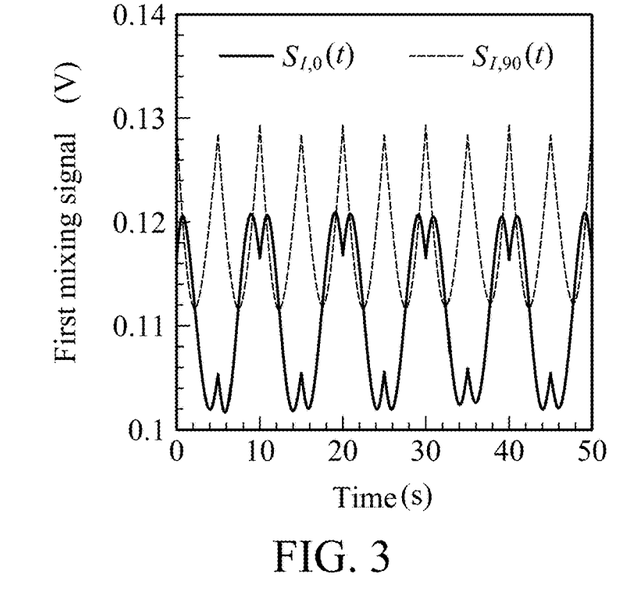
FIGS. 3 to 6 are the experiment results of the quadrature self-injection-locked radar in accordance with the first embodiment of the present invention.
Figure 4:
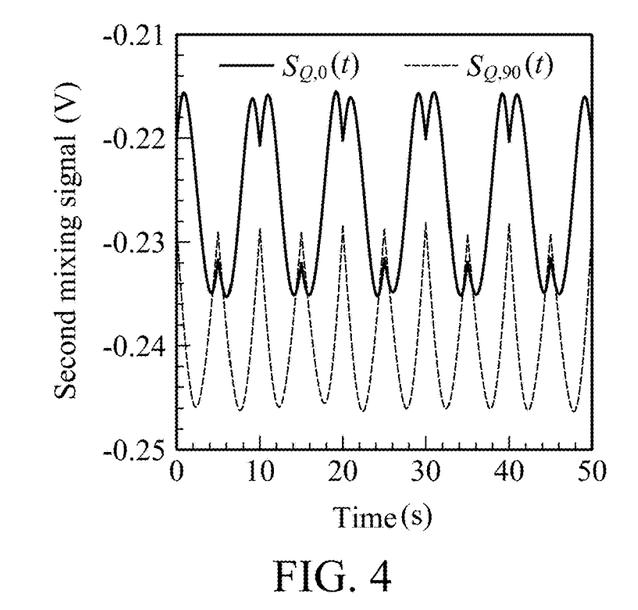
Figure 5:
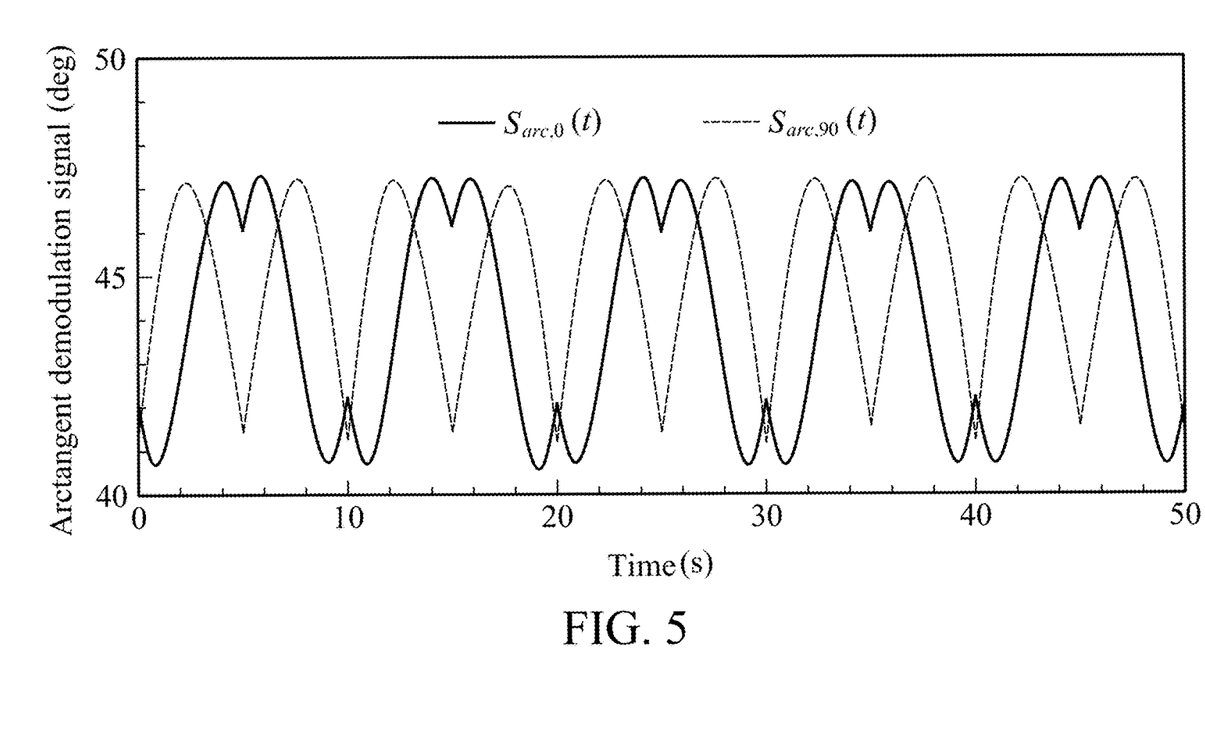
Figure 6:
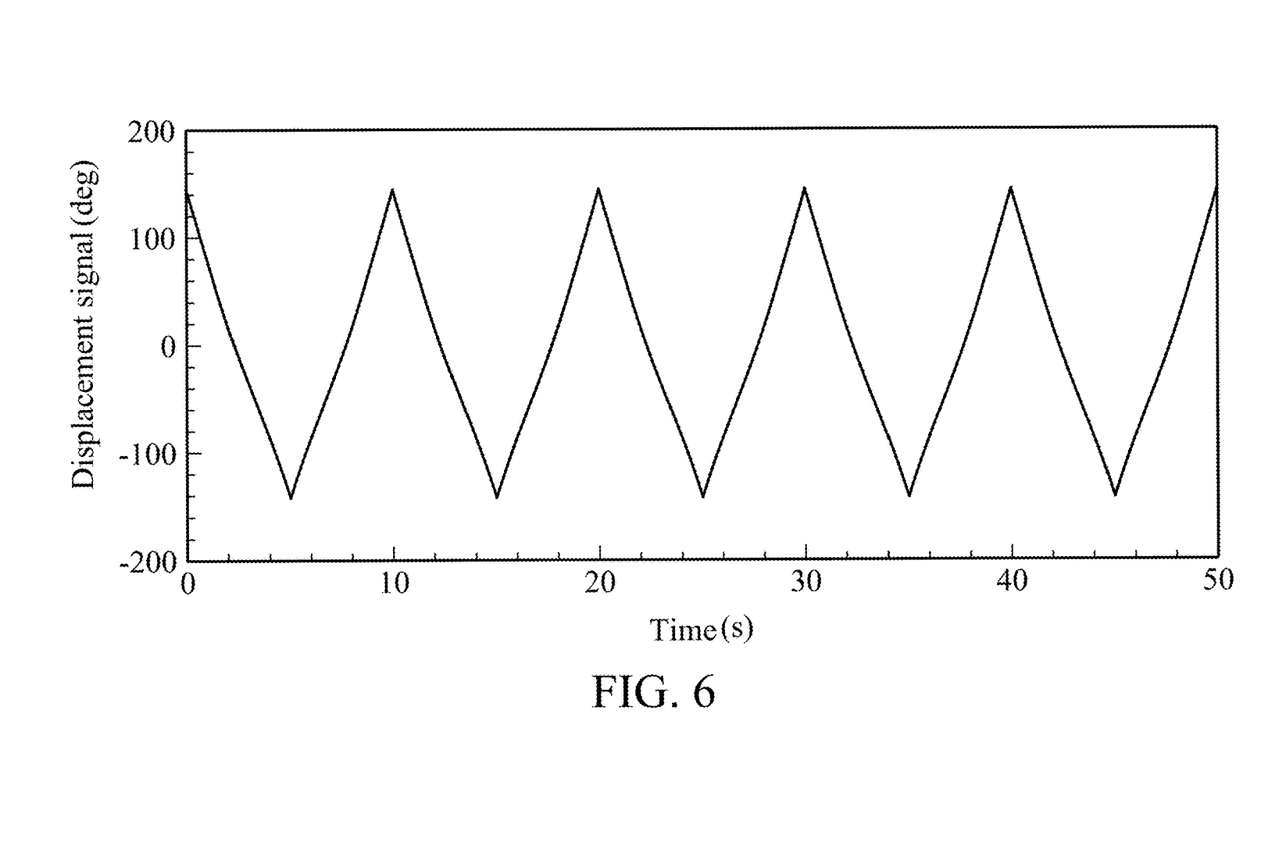
Figure 7:
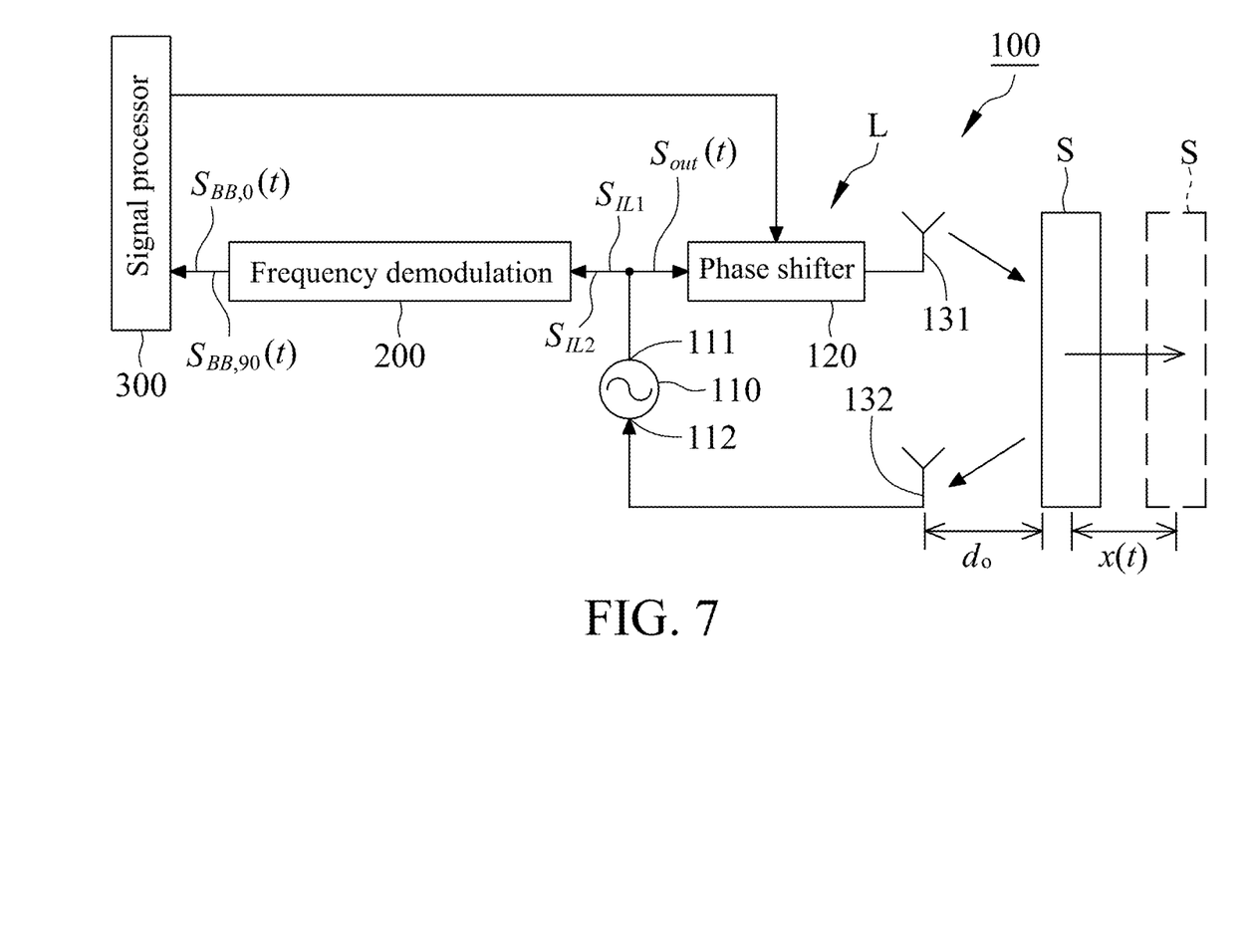
FIG. 7 is a functional block diagram illustrating a quadrature self-injection-locked radar in accordance with a second embodiment of the present invention.

With reference to FIGS. 3 to 6, they are the experiment results of the first embodiment, and the experiment is designed to detect the displacement information of a moving metal plate with constant speed, wherein the frequency and the displacement of the metal plate are 0.1 Hz and 5 cm respectively. With reference to FIGS. 3 and 4 which are the oscillograms of the first mixing signal $S_{I,0}(t)/S_{I,90}(t)$ and the second mixing signal $S_{Q,0}(t)/S_{Q,90}(t)$, it can be seen that the signals obtained from demodulation of the first SIL signal $S_{IL1}$ and the second SIL $S_{IL2}$ by the frequency demodulator 200 are distorted. With reference to FIG. 5, it is the oscillogram of the first arctangent demodulation signal $S_{arc,0}(t)$ and the second arctangent demodulation signal $S_{arc,90}(t)$ which are obtained from arctangent demodulation of the first mixing signal $S_{I,0}(t)/S_{I,90}(t)$ and the second mixing signal $S_{Q,0}(t)/S_{Q,90}(t)$. With reference to FIG. 6, it is the oscillogram of the displacement signal $\alpha_d(t)$ obtained from arctangent demodulation of the first arctangent demodulation signal $S_{arc,0}(t)$ and the second arctangent demodulation signal $S_{arc,90}(t)$, wherein the displacement signal $\alpha_d(t)$ is without waveform distortion. It can be seen that waveform distortion of the conventional SIL radar actually can be eliminated in the present invention, so the quadrature SIL radar 100 of the present invention can provide to detect the displacement information of the subject S moving in large range. With reference to FIG. 7, it is a functional block diagram illustrating a second embodiment of the present invention, wherein the difference between the first and the second embodiments is the location of the phase shifter 120. In the second embodiment, the signal output port 111 of the VCO 110 is electrically connected with the frequency demodulator 200 and the phase shifter 120, and the signal injection port 112 of the VCO 110 is electrically connected with the receive antenna 132. The oscillation signal $S_{out}(t)$ output from the VCO 110 is phase-shifted by the phase shifter 120 and transmitted to the transmit antenna 131, so the second embodiment also can utilize the phase shifter 120 to set the oscillation signal $S_{out}(t)$ with 90° phase shift in one phase mode and with 0° phase shift in the other phase mode. The subsequent signal processor 300 can eliminate the waveform distortion due to the oscillation signal $S_{out}(t)$ is operated in two phase modes.

Figure 8:
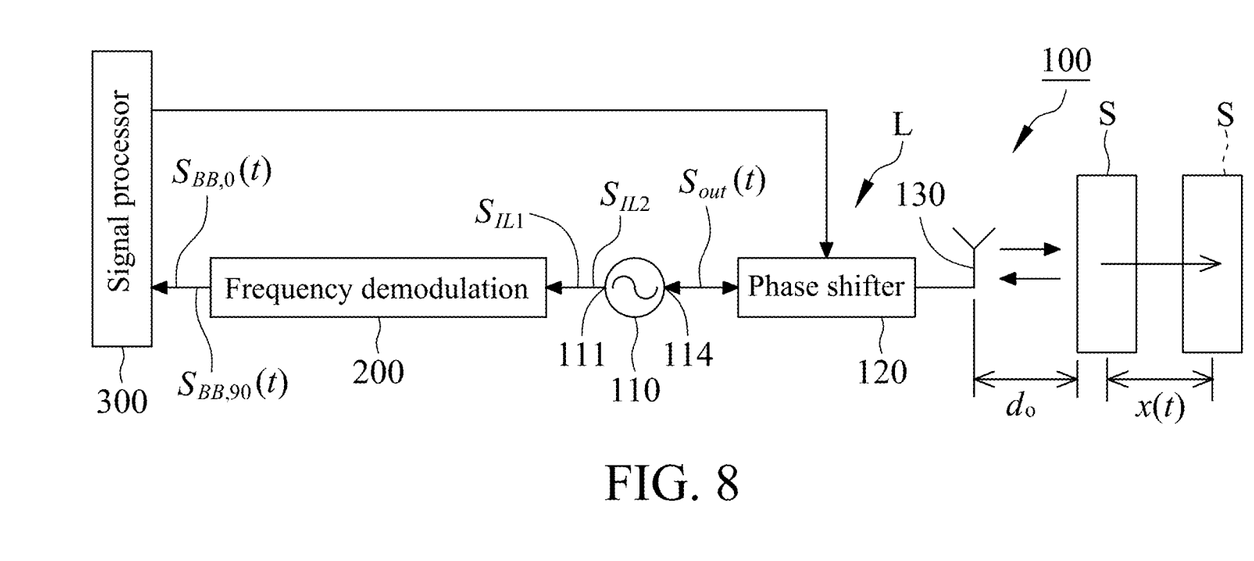
FIG. 8 is a functional block diagram illustrating a quadrature self-injection-locked radar in accordance with a third embodiment of the present invention.

With reference to FIG. 8, it is a functional block diagram illustrating a third embodiment of the present invention, wherein the difference from the first embodiment is there is only one transceiver antenna 130 in the third embodiment. The VCO 110 includes a signal output port 111 and a signal output/injection port 114, wherein the signal output port 111 is electrically connected with the frequency demodulator 200, and the signal output/injection port 114 is electrically connected with the phase shifter 120. The oscillation signal $S_{out}(t)$ output from the VCO 110 is phase-shifted by the phase shifter 120 and transmitted to the transceiver antenna 130 for radiation, the oscillation signal $S_{out}(t)$ reflected from the subject S is received by the transceiver antenna 130, phase-shifted by the phase shifter 120 and then injected into the signal output/injection port 114 of the VCO 110 to bring the VCO 110 to the SIL state. In the third embodiment, the oscillation signal $S_{out}(t)$ is phase-shifted by the phase shifter 120 twice in the SIL loop L, and the phase shift of the oscillation signal $S_{out}(t)$ is set as 45° in one phase mode and set as 0° in the other phase mode. Therefore, the phase difference of the oscillation signal $S_{out}(t)$ in two phase modes is 90°, and the subsequent signal processor 300 can eliminate the waveform distortion.

The present invention utilizes the phase shift of the phase shifter 120 to make the oscillation signal $S_{out}(t)$ operating in two phase modes and generating the first SIL signal $S_{IL1}$ and the second SIL signal $S_{IL2}$ during the self-injection locking. So the waveform distortion elimination through the signal processing could extend the application of the quadrature SIL radar of the present invention to more cases.

The scope of the present invention is only limited by the following claims. Any alternation and modification without departing from the scope and spirit of the present invention will become apparent to those skilled in the art.

What is claimed is:

1. A quadrature self-injection-locked radar comprising:
   a self-injection-locked (SIL) loop including a voltage-controlled oscillator (VCO), a phase shifter and a transceiver antenna, wherein the VCO outputs an oscillation signal, the phase shifter adjusts a phase of the oscillation signal to operate in two phase modes, and the transceiver antenna radiates the oscillation signal to a subject, wherein the oscillation signal reflected from the subject is received by the transceiver antenna and transmitted to the VCO for bringing the VCO to a self-injection-locked (SIL) state to generate a first self-injection-locked (SIL) signal and a second self-injection-locked (SIL) signal;
   a frequency demodulator for receiving the first and second SIL signals, wherein the frequency demodulator demodulates the first and second SIL signals in frequency to obtain a first frequency demodulation signal and a second frequency demodulation signal; and
   a signal processor for receiving and computing the first and second frequency demodulation signals to obtain a displacement signal of the subject.

2. The quadrature self-injection-locked radar in accordance with claim 1, wherein the VCO includes a signal output port and a signal injection port, and the transceiver antenna includes a transmit antenna and a receive antenna, wherein the signal output port is electrically connected with the frequency demodulator and the transmit antenna, the signal injection port is electrically connected with the phase shifter, and the phase shifter is electrically connected with the receive antenna, and wherein the oscillation signal reflected from the subject is received by the receive antenna, phase-shifted by the phase shifter and then transmitted to the signal injection port of the VCO for bringing the VCO to the SIL state.

3. The quadrature self-injection-locked radar in accordance with claim 2, wherein the phase shifter shifts the phase of the oscillation signal with 90° in one phase mode and shifts the phase of the oscillation signal with 0° in the other phase mode for the oscillation signal comprising 90° phase difference between the two phase modes.

4. The quadrature self-injection-locked radar in accordance with claim 1, wherein the VCO includes a signal output port and a signal injection port, and the transceiver antenna includes a transmit antenna and a receive antenna, wherein the signal output port is electrically connected with the frequency demodulator and the phase shifter, and the signal injection port is electrically connected with the receive antenna, and wherein the oscillation signal reflected from the subject is phase-shifted by the phase shifter and then transmitted to the transmit antenna.

5. The quadrature self-injection-locked radar in accordance with claim 3, wherein the phase shifter shifts the phase of the oscillation signal with 90° in one phase mode and shifts the phase of the oscillation signal with 0° in the other phase mode for the oscillation signal comprising 90° phase difference between the two phase modes.

6. The quadrature self-injection-locked radar in accordance with claim 1, wherein the VCO includes a signal output port electrically connected with the frequency demodulator and a signal output/injection port electrically connected with the phase shifter, and wherein the oscillation signal output from the VCO is phase-shifted by the phase shifter and then transmitted to the transceiver antenna, and the reflected oscillation signal is received by the receive antenna, phase-shifted by the phase shifter and then transmitted to the signal output/injection port of the VCO for bringing the VCO to the SIL state.

7. The quadrature self-injection-locked radar in accordance with claim 6, wherein the phase shifter shifts the phase of the oscillation signal with 45° in one phase mode and shifts the phase of the oscillation signal with 0° in the other phase mode for the oscillation signal comprising 90° phase difference between the two phase modes.

8. The quadrature self-injection-locked radar in accordance with claim 1, wherein the frequency demodulator includes a delay element, a quadrature power splitter with a 0° output end and a 90° output end, a first mixer and a second mixer, wherein the delay element and the quadrature power splitter are electrically connected with the SIL loop, the first mixer is electrically connected with the delay element and the 0° output end of the quadrature power splitter, and the second mixer is electrically connected with the delay element and the 90° output end of the quadrature power splitter, and wherein the first mixer outputs a first mixing signal, the second mixer outputs a second mixing signal, and the signal processor receives the first and second mixing signals.

9. The quadrature self-injection-locked radar in accordance with claim 8, wherein the frequency demodulator further includes a first low-pass filter (LPF) electrically connected with the first mixer and a second low-pass filter electrically connected with the second mixer, and wherein the first mixing signal is transmitted to the signal processor through the first LPF, and the second mixing signal is transmitted to the signal processor through the second LPF.

10. The quadrature self-injection-locked radar in accordance with claim 1, wherein the signal processor demodulates the first and second frequency demodulation signals by an arctangent demodulation to obtain a demodulation signal.

11. The quadrature self-injection-locked radar in accordance with claim 10, wherein the arctangent demodulation is presented as formula 1, and $S_{demod}(t)$ is the demodulation signal, $S_{BB,0}(t)$ is the first frequency demodulation signal, $S_{BB,90}(t)$ is the second frequency demodulation signal, and $\alpha_d(t)$ is a phase variation caused by the displacement of the subject.

$$S_{demod}(t) = \tan^{-1}\frac{-S_{BB,0}(t)}{S_{BB,90}(t)} = \alpha_d(t). \tag{1}$$

12. The quadrature self-injection-locked radar in accordance with claim 11, wherein the phase variation caused by the displacement of the subject is present as formula 2, and c is a speed of light, $d_0$ is an initial distance between the subject and the transceiver antenna, x(t) is a displacement amplitude of the subject, $\omega_{osc}$ is an initial oscillation frequency of the VCO.

$$\alpha_d(t) = \frac{2\omega_{osc}}{c}(d_0 + x(t)). \tag{2}$$

* * * * *